US007741228B2

(12) United States Patent

Ueki et al.

(10) Patent No.: US 7,741,228 B2
(45) Date of Patent: Jun. 22, 2010

(54) METHOD FOR FABRICATING SEMICONDUCTOR DEVICE

(75) Inventors: Akira Ueki, Osaka (JP); Takeshi Harada, Shiga (JP); Atsushi Ishii, Tokyo (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 12/059,768

(22) Filed: Mar. 31, 2008

(65) Prior Publication Data

US 2008/0299763 A1 Dec. 4, 2008

(30) Foreign Application Priority Data

May 28, 2007 (JP) ............................ 2007-140217

(51) Int. Cl.
*H01L 21/302* (2006.01)
*H01L 21/461* (2006.01)

(52) U.S. Cl. ............... 438/736; 438/739; 257/E21.581; 257/E21.573; 257/E21.585

(58) Field of Classification Search ................. 438/736, 438/945, 739, 950; 257/E21.581, E21.638, 257/E21.672, E21.585, E21.579, E21.573
See application file for complete search history.

(56) References Cited

U.S. PATENT DOCUMENTS

| | | | | |
|---|---|---|---|---|
| 6,995,439 | B1 * | 2/2006 | Hill et al. | 257/396 |
| 7,405,147 | B2 * | 7/2008 | Edelstein et al. | 438/618 |
| 2005/0221600 | A1 * | 10/2005 | Daamen et al. | 438/622 |

FOREIGN PATENT DOCUMENTS

| | | |
|---|---|---|
| JP | 2006-120988 | 5/2006 |

* cited by examiner

*Primary Examiner*—Caridad M Everhart
(74) *Attorney, Agent, or Firm*—McDermott WIll & Emery LLP

(57) ABSTRACT

After a first insulating film is formed on a substrate, a wiring groove is formed in the first insulating film, and then a wire is formed inside the wiring groove. Subsequently, a protection film is formed on the first insulating film and on the wire, and then a hard mask film is formed on the protection film. After that, the hard mask film is patterned. Subsequently, the protection film and the first insulating film are partially removed using the patterned hard mask film to form an air gap groove, and then a second insulating film is formed to close an upper portion of the air gap groove for forming an air gap.

19 Claims, 7 Drawing Sheets

METHOD FOR FABRICATING SEMICONDUCTOR DEVICE

BACKGROUND OF THE INVENTION

1. Field of the Invention

The present invention relates to a method for fabricating a semiconductor device.

2. Description of the Prior Art

Progressing miniaturization of semiconductor integrated circuit device in recent years narrows a wire-to-wire spacing. This results in a problem that capacitance between wires increases, lowering the propagation velocity of a signal. To reduce the capacitance between the wires, it has been studied to embed an insulating film material having a low dielectric constant between the wires. Meanwhile, it has also been studied to form an air gap between the wires to reduce the capacitance between the wires. A conventional method for forming the air gap disclosed in Patent Document 1 will be described below with reference to the drawings.

First, as illustrated with FIG. 5A, on a surface of a semiconductor substrate 1, an insulating film 2 is formed.

Then, as illustrated with FIG. 5B, photolithography and dry etching are performed to form wiring grooves 3 in an upper portion of the insulating film 2.

Then, as illustrated with FIG. 5C, over the insulating film 2 and inside the wiring grooves 3, a barrier film 4 and a Cu film 5 are sequentially deposited. Then, part of the barrier film 4 and part of the Cu film 5 which are lying outside the wiring grooves 3 are removed by CMP (chemical mechanical polishing) to form lower wires 6.

Then, as illustrated with FIG. 5D, CVD (chemical vapor deposition) or electroless plating is performed for selective growth of a cap film 7 on respective surfaces of the lower wires 6.

Then, as illustrated with FIG. 6A, CVD is performed to deposit a protection film 8 on the insulating film 2 and on the cap film 7 covering the lower wires 6.

Then, as illustrated with FIG. 6B, photolithography is performed to form a patterned resist mask 9 on the protection film 8. The resist mask 9 has an opening in an air gap formation region, and the air gap formation region can be defined by the opening.

Then, as illustrated with FIG. 6C, part of the protection film 8 located in the air gap formation region is removed using the resist mask 9.

Then, as illustrated with FIG. 7A, part of the insulating film 2 located between the lower wires 6 is removed by dry etching using part of the cap film 7 located in the air gap formation region and the resist mask 9 as a mask so that air gap grooves 10 are formed. Then, the resist mask 9 is removed.

Then, as illustrated with FIG. 7B, CVD is performed to deposit an insulating film 11 over the entire surface of the semiconductor substrate 1. This closes upper portions of the air gap grooves 10 with the insulating film 11 before the air gap grooves 10 are filled with the insulating film 11, thereby forming air gaps 12.

[Patent Document 1] Japanese Laid-Open Patent Publication No. 2006-120988

SUMMARY OF THE INVENTION

However, the above-mentioned conventional technique has problems as follows.

A first problem is that when the resist mask 9 used in the step of FIG. 6C (in the step of removing the protection film 8) is removed or when a polymer is removed, the cap film 7 is oxidized or damaged as illustrated with FIG. 8. When the cap film 7 is oxidized or damaged, the cap film 7 no longer serves as a diffusion prevention film for the Cu film 5 constituting the lower wires 6, which may cause a reduction in yield. It is to be noted that in FIG. 8, ↓ indicates oxygen plasma.

A second problem is that when the part of the insulating film 2 located between the lower wires 6 is etched in the step of FIG. 7A (in the step of forming the air gap grooves 10), a damage layer 13 is formed in the protection film 8 as shown in FIG. 8. When the damage layer 13 is formed as in this case, adhesion between the insulating film 11 deposited in the step illustrated with FIG. 7B and the protection film 8 may be reduced, or the reliability of the device may decrease.

A third problem is that the resist mask 9 which is used in the step of FIG. 6C (in the step of removing the protection film 8) and in the step of FIG. 7A (in the step of forming the air gap grooves 10) does not have sufficient etching resistance. That is, when a resist film thickness sufficient for removing the protection film 8 and the insulating film 2 between the wires can not be ensured, the resist mask 9 is etched away during etching of the insulating film 2 between the wires, so that the protection film 8 is etched, which may lead to a reduction in reliability of the device.

The present invention is made in view of the above-mentioned problems of the conventional technique. An object of the present invention is to provide a method for fabricating a semiconductor device which realizes a high yield and in which the capacitance between wires can be sufficiently reduced by an air gap.

To achieve the above-mentioned object, a method for fabricating a semiconductor device according to the present invention includes the steps of: (a) forming a first insulating film on a substrate; (b) forming a wiring groove in the first insulating film; (c) forming a wire inside the wiring groove; (d) forming a protection film on the first insulating film and on the wire; (e) forming a hard mask film on the protection film; (f) patterning the hard mask film; (g) partially removing the protection film and the first insulating film using the patterned hard mask film to form an air gap groove; and (h) forming a second insulating film to close an upper portion of the air gap groove for forming an air gap.

According to the method for fabricating the semiconductor device of the present invention, the hard mask film is formed on the protection film, and thus the resist mask used for patterning the hard mask film can be removed with the wire or its cap film (diffusion prevention film) being covered with the protection film, in other words, with the wire or its cap film not being exposed. Therefore, oxidation of the wire or its cap film in resist removal or subsequent polymer removal can be prevented, so that it is possible to prevent a reduction in yield.

Moreover, when the air gap groove is formed in the insulating film (first insulating film) located between the wires, the protection film is covered with the hard mask film, and thus the protection film is not directly etched. This makes it possible to suppress damage to the protection film, so that it is possible to prevent a reduction in yield.

Moreover, in the step of forming the air gap groove (including partially removing the protection film), the resist mask is not used but instead the hard mask film is used. Therefore, various problems resulting from a reduction in the thickness of the resist film during etching do not, of course, arise.

As described above, the present invention relates to a method for fabricating a semiconductor device. Especially, when the present invention is applied to a technique for forming an air gap between wires, the fabrication yield of a semiconductor device in which capacitance between the wires can sufficiently be reduced by the air gap is improved, and thus the present invention is very useful.

DESCRIPTION OF THE PREFERRED EMBODIMENTS

Embodiment 1

A method for fabricating a semiconductor device according to Embodiment 1 of the present invention will be described below with reference to the drawings.

FIGS. 1A through 1D, FIGS. 2A through 2D, and FIGS. 3A through 3D are cross-sectional views illustrating respective steps in the method for fabricating the semiconductor device according to Embodiment 1.

Figure 1A:
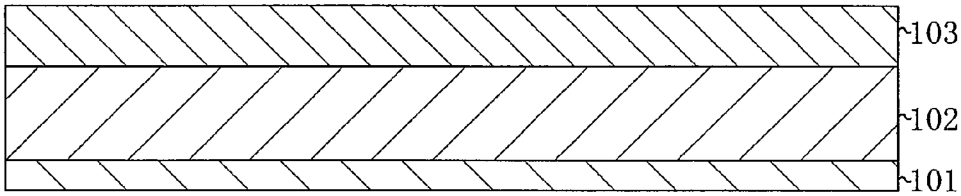
FIGS. 1A through 1D are cross-sectional views illustrating respective steps of a method for fabricating a semiconductor device according to Embodiment 1 of the present invention.

First, as illustrated with FIG. 1A, over a semiconductor substrate 101, an inter-layer insulating film 102 and an inter-wire insulating film 103 are formed. It is to be noted that in the present embodiment, as the inter-layer insulating film 102, for example, a SiOC film is used, and as the inter-wire insulating film 103, for example, a TEOS (tetraethylorthosilicate) film is used.

Figure 1B:
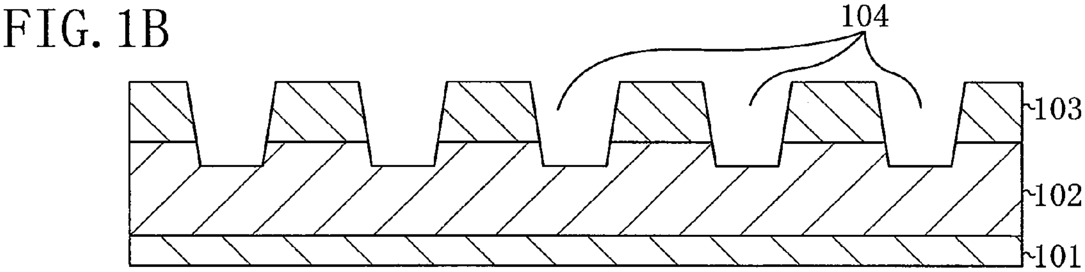

Then, as illustrated with FIG. 1B, photolithography and dry etching are performed to form wiring grooves 104 which penetrate through the inter-wire insulating film 103 and reach inside the inter-layer insulating film 102.

Figure 1C:
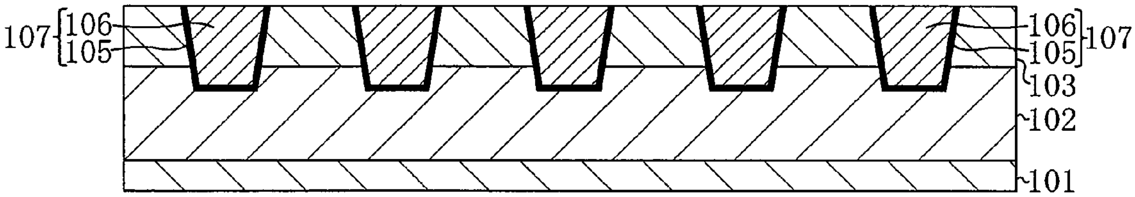

Then, as illustrated with FIG. 1C, over the inter-wire insulating film 103 and inside the wiring grooves 104, a barrier film 105 and a conducting layer 106 are sequentially deposited. Then, part of the barrier film 105 and part of the conducting layer 106 which are lying outside the wiring grooves 104 are removed by, for example, CMP to form lower wires 107 inside the wiring grooves 104. It is to be noted that in the present embodiment, as the barrier film 105, for example, a film in which a TaN film and a Ta film are stacked in this order is used, and as the conducting layer 106, for example, a Cu film is used.

Figure 1D:
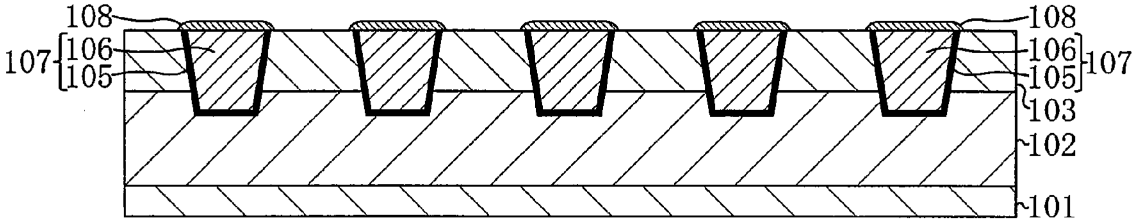

Then, as illustrated with FIG. 1D, for example, CVD or electroless plating is performed for selective growth of a cap film 108 covering the lower wires 107. It is to be noted that in the present embodiment, as the cap film 108, a CoWP (cobalt tungsten phosphorus) film grown by electroless plating is used. End portions of the cap film 108 may extend on part of the inter-wire insulating film 103 which is located close to the lower wires 107.

Figure 2A:
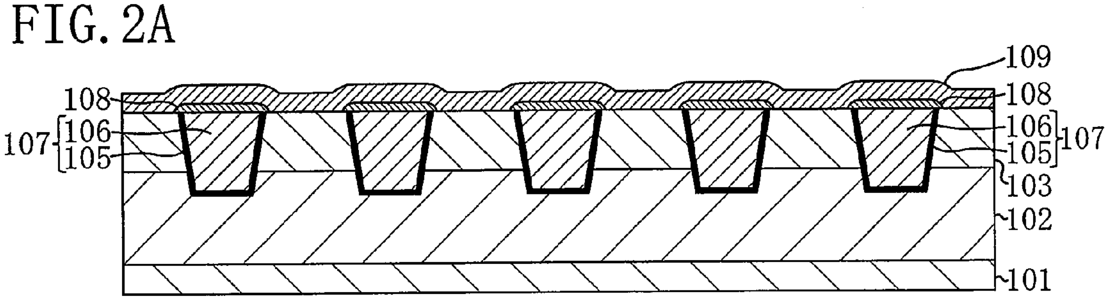
FIGS. 2A through 2D are cross-sectional views illustrating respective steps of the method for fabricating the semiconductor device according to Embodiment 1 of the present invention.

Then, as illustrated with FIG. 2A, on the inter-wire insulating film 103 and on the cap film 108 covering the lower wires 107, a protection film 109 is formed. It is to be noted that in the present embodiment, as the protection film 109, for example, a SiCN film is used.

Figure 2B:
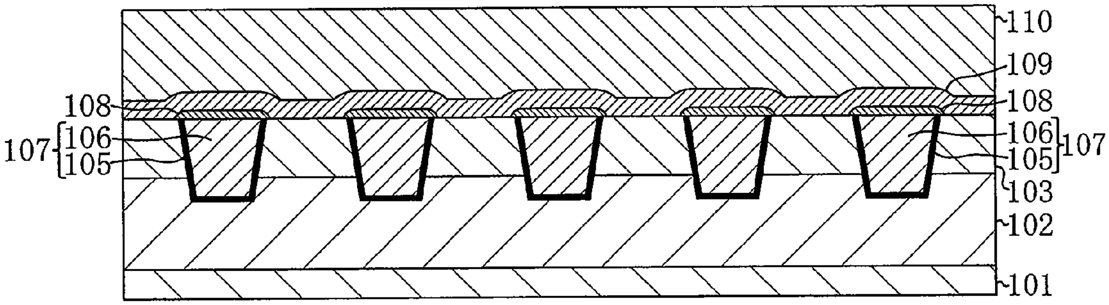

Then, as illustrated with FIG. 2B, on the protection film 109, a hard mask film 110 is deposited. That is, the hard mask film 110 serves as a hard mask in an etching step which will be described later. It is to be noted that in the present embodiment, as the hard mask film 110, a TEOS film is deposited for example.

Figure 2C:
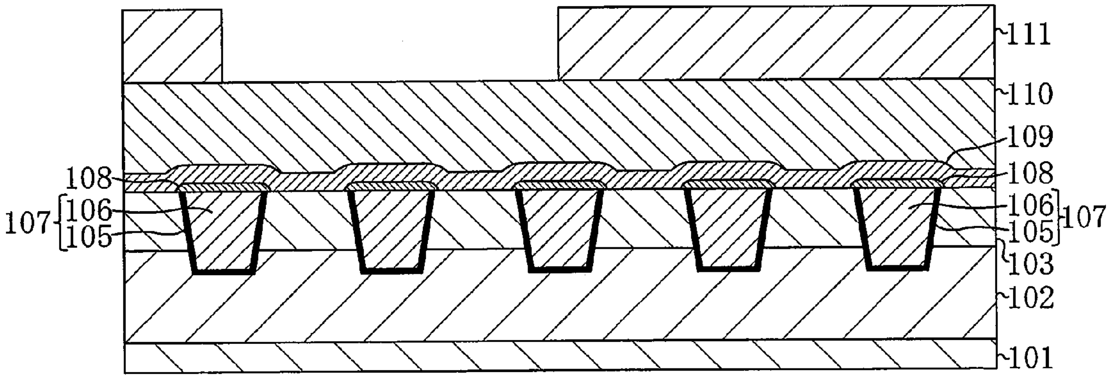

Then, as illustrated with FIG. 2C, photolithography is performed to form a resist mask 111 on the hard mask film 110, the resist mask 111 having an opening in an air gap formation region. This makes it possible to differently process the air gap formation region and non-formation region in an air gap formation step described later.

Figure 2D:
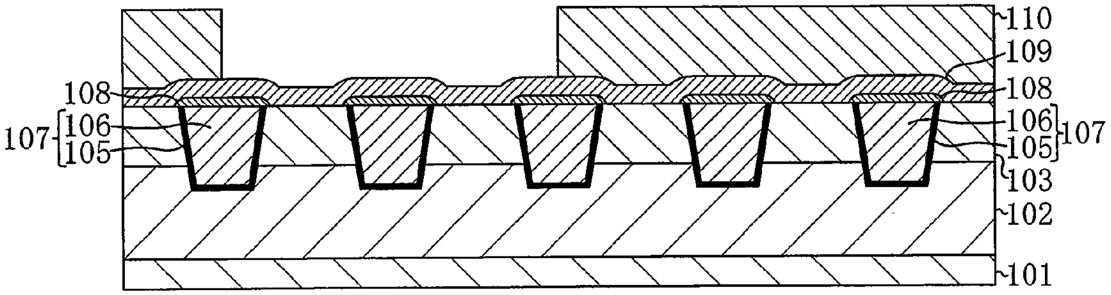

Then, as illustrated with FIG. 2D, part of the hard mask film 110 which is not covered with the resist mask 111 and thus exposed is removed by etching. Then, ashing and cleaning is performed to remove the resist mask 111. In this step, the cap film 108 is covered with the protection film 109, and thus the cap film 108 is not oxidized by ashing or the like.

Then, as illustrated with FIG. 3A, part of the protection film 109 which is not covered with the hard mask film 110 (patterned hard mask film 110; which applies in description below) and thus exposed is removed by etching.

Subsequently, as illustrated with FIG. 3B, by using the hard mask film 110 and the cap film 108 located in the air gap formation region as a mask, part of the inter-wire insulating film 103 which is not covered with the hard mask film 110 and thus exposed is removed by etching to form air gap grooves 112.

Figure 3A:
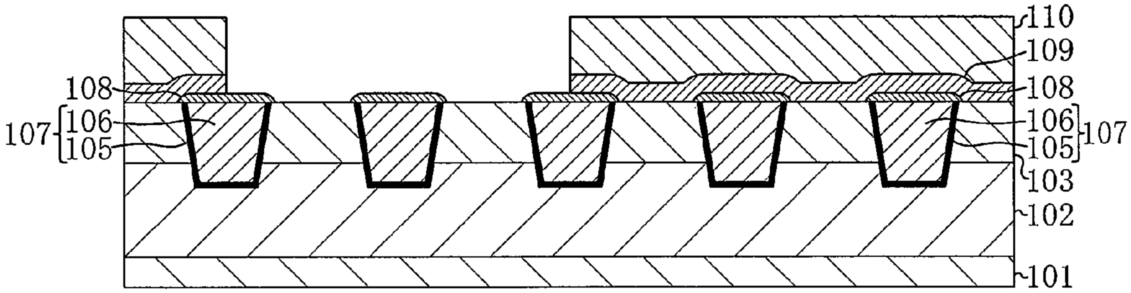
FIGS. 3A through 3D are cross-sectional views illustrating respective steps of the method for fabricating the semiconductor device according to Embodiment 1 of the present invention.
Figure 3B:
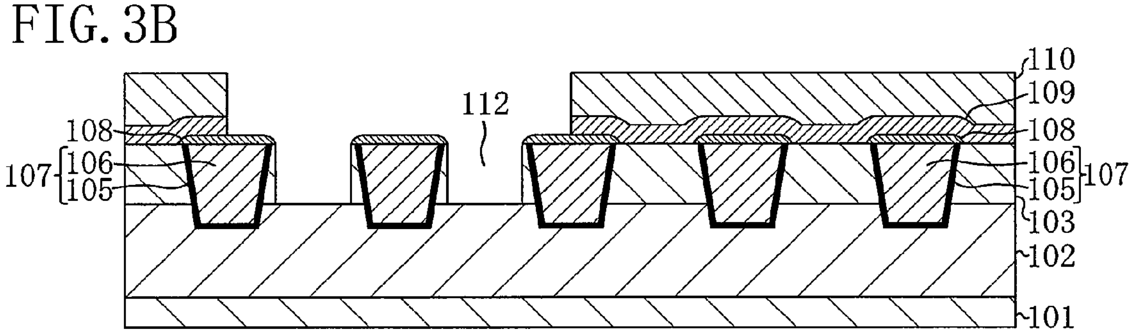
Figure 3C:
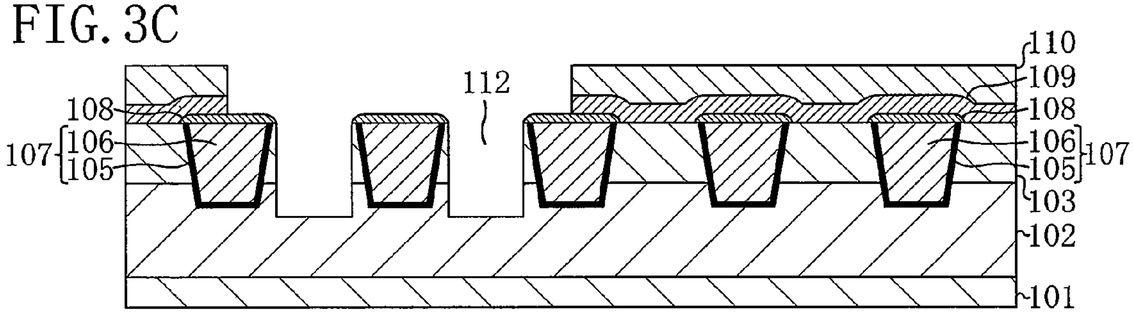

Further, as illustrated with FIG. 3C, part of the inter-layer insulating film 102 which is to be a bottom of each air gap groove 112 is etched by about 100 nm. This can extend the air gap grooves 112, enlarging the air gaps which are to be formed in the air gap grooves 112 in a next step. Therefore, it is possible to further lower the capacitance between the wires (lower wires 107).

It is to be noted that etching of the protection film 109, the inter-wire insulating film 103, and the inter-layer insulating film 102 illustrated with FIGS. 3A through 3C may be performed consecutively by wet etching.

Figure 3D:
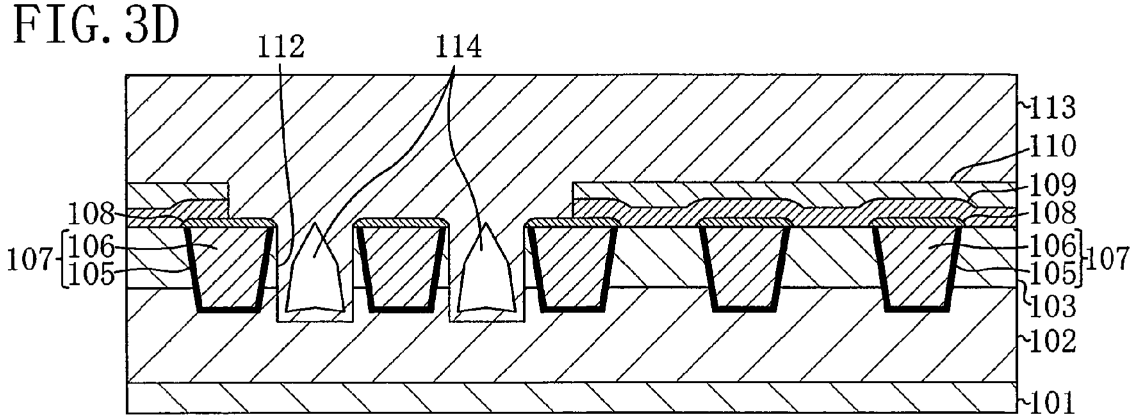

Then, as illustrated with FIG. 3D, for example, CVD is performed to deposit an inter-layer insulating film 113 over the entire surface of the semiconductor substrate 101. This closes upper portions of the air gap grooves 112 with the inter-layer insulating film 113 before the air gap grooves 112 are filled with the inter-layer insulating film 113, thereby forming air gaps 114. It is to be noted that in the present embodiment, as the inter-layer insulating film 113, for example, a SiOC film is used.

As described above, according to the present embodiment, resist removal, polymer removal, or the like is not performed with the cap film 108 which covers the lower wires 107 being exposed (see FIGS. 3A through 3C), and thus the cap film 108 is not oxidized or damaged. Therefore, it is possible to prevent a reduction in yield.

In the final structure of the semiconductor device of the present embodiment formed by the steps mentioned above, a feature is that the hard mask film 110 is deposited on the protection film 109 as shown in FIG. 3D.

Here, the function of the hard mask film 110 which is a feature of the present invention will be described. The hard mask film 110 is used as a mask for etching the protection film 109 and the inter-wire insulating film 103. That is, this is because it is thought that etching resistance of the resist mask is insufficient for etching the protection film 109 and the inter-wire insulating film 103 using only the resist mask. In other words, using the hard mask film 110 as a mask makes it possible to avoid various problems resulting from a reduction in the thickness of the resist film during etching.

Moreover, using the hard mask film 110 as a mask, as described above, makes it possible to prevent the cap film 108 (specifically, CoWP constituting the cap film 108) from being oxidized, for example, during the removal of the resist mask. This makes it possible to prevent a reduction in yield.

Moreover, when the air gap grooves 112 are formed in the inter-wire insulating film 103, the protection film 109 is covered with the hard mask film 110, and thus the protection film 109 is not directly etched. Therefore, it is possible to suppress damage to the protection film 109, and thus it is possible to prevent a reduction in reliability.

It is to be noted that in the present embodiment, a TEOS film is used as the hard mask film 110, but as an alternative to the TEOS film, a FSG film, a $SiO_2$ film, a SiOC film, a SiN film, a SiCO film, a SiCN film, an AlO film, or the like may be used. Instead of such an insulating film, a metal film such as a Ti film, a Ta film, or an Al film may be used alternatively.

Moreover, in the present embodiment, a TEOS film is used as the inter-wire insulating film 103, but as an alternative to the TEOS film, a FSG (fluorine-doped silicate glass) film or the like may be used.

Moreover, in the present embodiment, a SiCN film is used as the protection film 109, but as an alternative to the SiCN film, a SiN film, a SiC film, or the like may be used.

Moreover, in the present embodiment, a film in which a TaN film and a Ta film are stacked in this order is used as the barrier film 105, but it is preferable that the barrier film 105 includes a metal nitride or a metal silicide nitride. It is more preferable that the metal included in the metal nitride or the metal silicide nitride is titanium, tantalum, or tungsten.

Moreover, in the present embodiment, a CoWP film is used as the cap film 108, but it is preferable that the cap film 108 includes tungsten or a tungsten alloy, and more preferably, the tungsten alloy is cobalt tungsten phosphorus, cobalt tungsten boron, or cobalt tungsten phosphorus boron. Alternatively, it is preferable that the cap film 108 includes a metal nitride or a metal silicide nitride, and more preferably, the metal included in the metal nitride or the metal silicide nitride is titanium, tantalum, or tungsten.

Embodiment 2

A method for fabricating a semiconductor device according to Embodiment 2 of the present invention will be described below with reference to the drawings. It is to be noted that descriptions as to Embodiment 2 are given of only different points from Embodiment 1 described above, and the same descriptions as those of Embodiment 1 are not repeated.

Figure 4A:
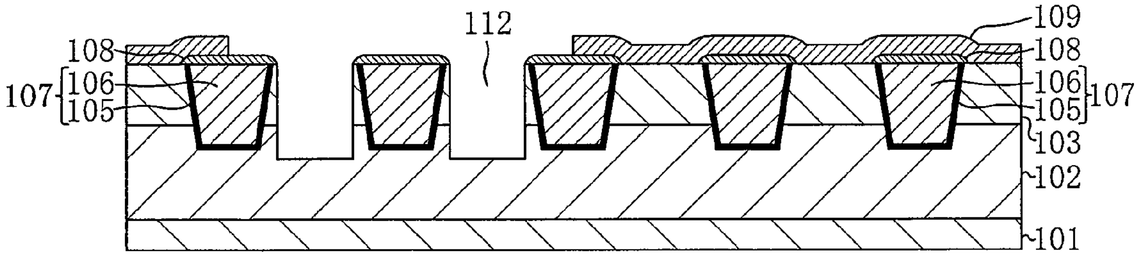
FIG. 4A is a cross-sectional view illustrating a step of a method for fabricating a semiconductor device according to Embodiment 2 of the present invention.

FIG. 4A is a cross-sectional view illustrating a step of the method for fabricating the semiconductor device according to Embodiment 2. The present embodiment is different from Embodiment 1 in that between the step of forming the air gap grooves 112 of FIG. 3C and the step of forming the air gaps 114 of FIG. 3D (the step of forming the inter-layer insulating film 113), the hard mask film 110 is removed by wet etching or the like as illustrated with FIG. 4A. This makes it possible to directly deposit the inter-layer insulating film 113 on the protection film 109 in the step of forming the air gaps 114 of FIG. 3D. Therefore, it is possible to eliminate, for example, variations in film thickness caused when the hard mask film 110 is left (to eliminate, for example, steps on a surface of the inter-layer insulating film 113 resulting from the presence or absence of the hard mask film 110).

Figure 4B:
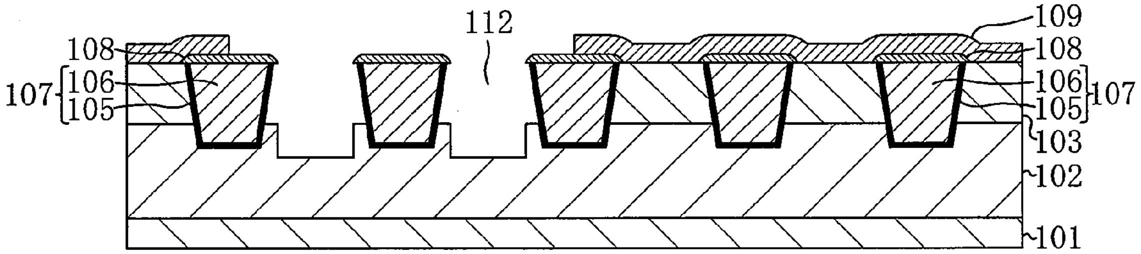
FIG. 4B is a cross-sectional view illustrating a variation of the step of FIG. 4A.
Figure 5A:
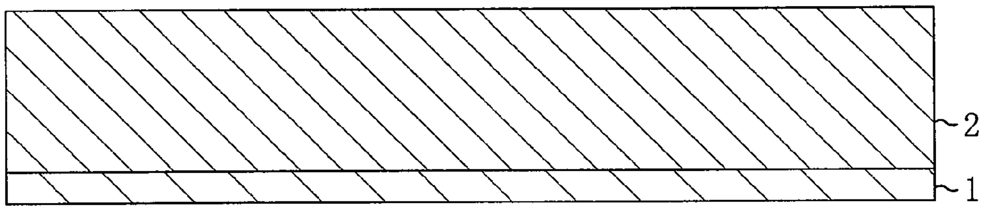
FIGS. 5A through 5D are cross-sectional views illustrating respective steps of a conventional method for fabricating a semiconductor device.
Figure 5B:
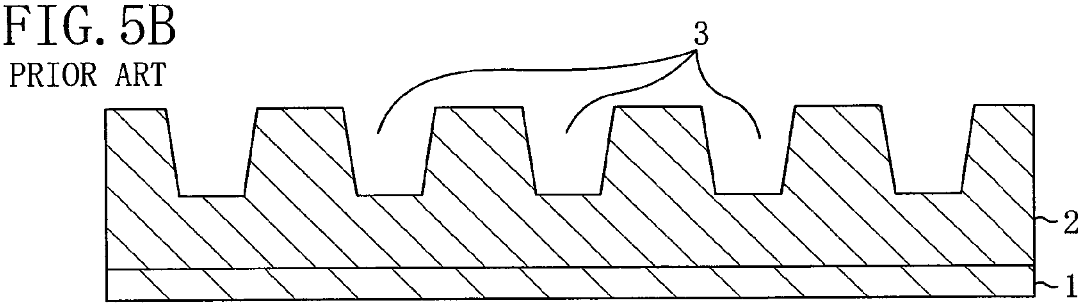
Figure 5C:
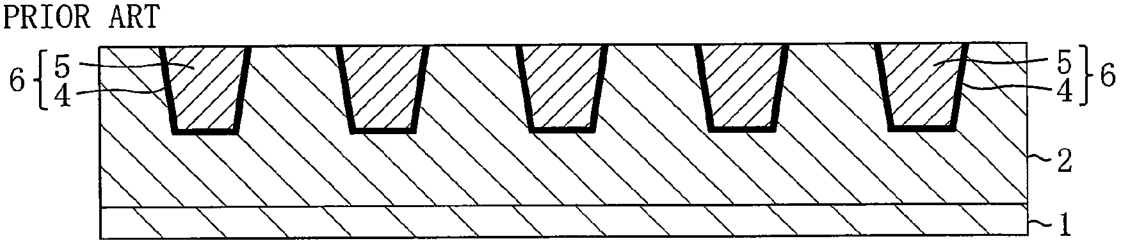
Figure 5D:
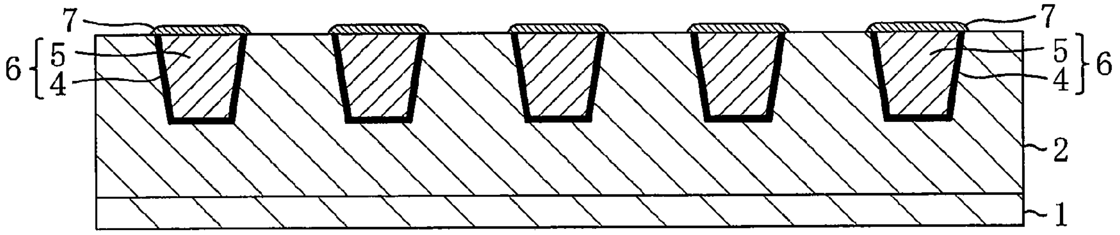
Figure 6A:
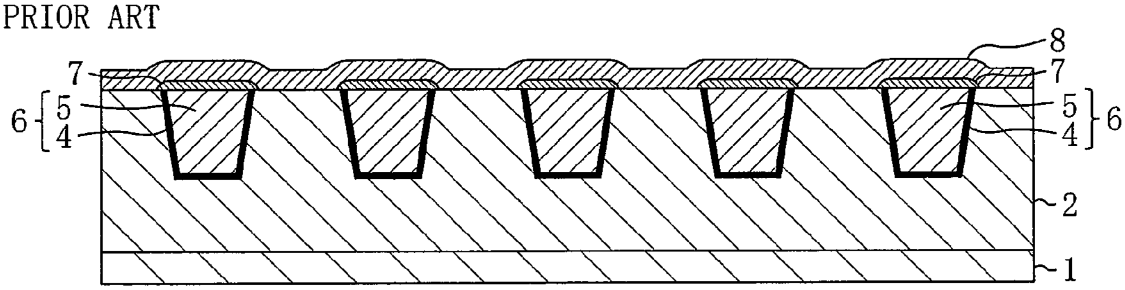
FIGS. 6A through 6C are cross-sectional views illustrating respective steps of the conventional method for fabricating the semiconductor device.
Figure 6B:
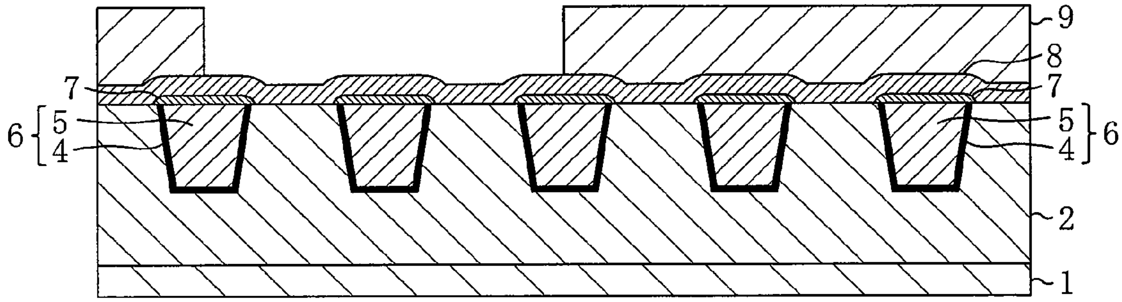
Figure 6C:
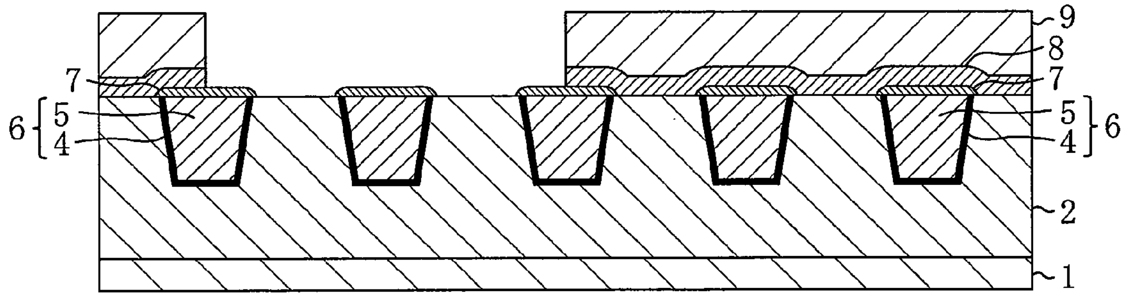
Figure 7A:
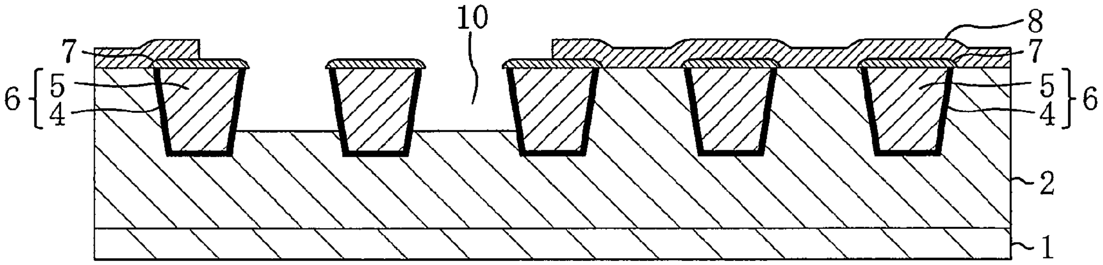
FIGS. 7A and 7B are cross-sectional views illustrating respective steps of the conventional method for fabricating the semiconductor device.
Figure 7B:
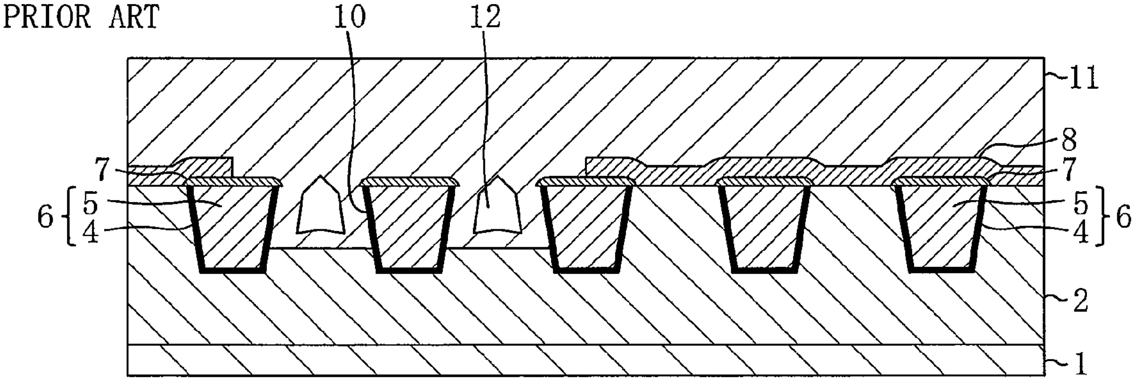
Figure 8:
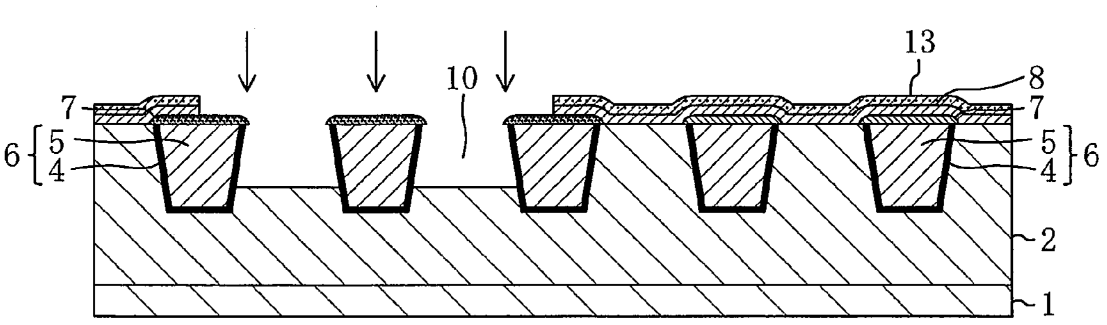
FIG. 8 is a view illustrating problems in the conventional method for fabricating the semiconductor device.

Moreover, in the present embodiment, for example, using a chemical solution capable of etching both the inter-wire insulating film 103 and the hard mask film 110 in the step of FIG. 4A makes it possible to further remove the inter-wire insulating film 103 remaining between the wires (lower wires 107) in the air gap formation region as shown in FIG. 4B. That is, further removing part of the inter-wire insulating film 103 located near the air gap grooves 112 allows the air gap grooves 112 to be extended. This further enlarges the air gaps 114, so that it is possible to further lower the dielectric constant in an inter-wire region.

It is to be noted that in Embodiment 1 or Embodiment 2, descriptions are given of formation of air gaps between wires (so-called M1 wires) embedded in the insulating film directly on the semiconductor substrate, but of course, applying the present invention to form air gaps between wires embedded in an upper layer produces the same effect.

What is claimed is:

1. A method for fabricating a semiconductor device comprising the steps of:

(a) forming a first insulating film on a substrate;

(b) forming a wiring groove in the first insulating film;

(c) forming a wire inside the wiring groove;

(d) forming a protection film on the first insulating film and on the wire;

(e) forming a hard mask film on the protection film;

(f) patterning the hard mask film;

(g) partially removing the protection film and the first insulating film using the patterned hard mask film to form an air gap groove; and (h) forming a second insulating film to close an upper portion of the air gap groove for forming an air gap, wherein:

the method further includes, between the steps (g) and (h), step of (i) removing the hard mask film, and the step (i) includes performing wet etching to remove the hard mask film, and removing part of the first insulating film located near the air gap groove to extend the air gap groove.

2. The method of claim 1, wherein the first insulating film is a $SiO_2$ film or a FSG film.

3. The method of claim 1, wherein the protection film is a SiN film, a SiC film, or a SiCN film.

4. The method of claim 1, wherein the hard mask film is a TEOS film, a SiOC film, a SiN film, a SiCO film, or a SiCN film.

5. The method of claim 1, wherein the hard mask film is a metal film.

6. The method of claim 1, wherein step (f) includes:

forming a resist mask on the hard mask film;

partially removing the hard mask film using the resist mask to pattern the hard mask film; and removing the resist mask.

7. The method of claim 1, wherein step (g) includes performing wet etching to partially remove the first insulating film.

8. The method of claim 1, wherein step (c) includes:

sequentially stacking a barrier film and a conducting layer over the first insulating film and inside the wiring groove; and removing part of the barrier film and part of the conducting layer which are lying outside the wiring groove.

9. The method of claim 8, wherein the barrier film includes a metal nitride or a metal silicide nitride.

10. The method of claim 9, wherein a metal included in the metal nitride or the metal silicide nitride is titanium, tantalum, or tungsten.

11. The method of claim 1, wherein step (c) includes forming a cap film covering an upper surface of the wire.

12. The method of claim 11, wherein the cap film includes tungsten or a tungsten alloy.

13. The method of claim 12, wherein the tungsten alloy is cobalt tungsten phosphorus, cobalt tungsten boron, or cobalt tungsten phosphorus boron.

14. The method of claim 11, wherein the cap film includes a metal nitride or a metal silicide nitride.

15. The method of claim 14, wherein a metal included in the metal nitride or the metal silicide nitride is titanium, tantalum, or tungsten.

16. A method for fabricating a semiconductor device comprising the steps of:

(a) forming a first insulating film on a substrate;

(b) forming a plurality of wires adjacent to each other in the first insulating film;

(c) forming a hard mask film on the first insulating film and on the plurality of wires;

(d) patterning the hard mask film to form an opening;

(g) removing a part of the first insulating film located under the opening of the patterned hard mask film to form an air gap groove; and (h) forming a second insulating film to close an upper portion of the air gap groove for forming an air gap, wherein:

a width of the opening is equal to or larger than a size of an inter-wire space of the plurality of wires, and the hard mask film is a TEOS film, a SiOC film, a SiN film, s SiCO film, a SiCN film or a metal film.

17. The method of claim 16, further comprising, between (b) and (c), forming a protection film on the first insulating film and on the plurality of wires.

18. The method of claim 16, further comprising, between (e) and (f), removing a part of the first insulating film located near the air gap groove to extend the air gap groove.

19. The method of claim 16, wherein:

at the step of (d), the opening is formed over a first inter-wire space of the plurality of wires and the opening is not formed over a second inter-wire space of the plurality of wires, at the step of (e), the air gap groove is formed in the first inter-wire space and the air gap groove is not formed in the second inter-wire space, and at the step of (f), the air gap is formed in the first inter-wire space and the air gap is not formed in the second inter-wire space.

* * * * *

UNITED STATES PATENT AND TRADEMARK OFFICE

CERTIFICATE OF CORRECTION

PATENT NO. : 7,741,228 B2
APPLICATION NO. : 12/059768
DATED : June 22, 2010
INVENTOR(S) : Akira Ueki et al.

It is certified that error appears in the above-identified patent and that said Letters Patent is hereby corrected as shown below:

ON THE TITLE PAGE:

In Item “(73) Assignee”, add --Renesas Technology Corp., Tokyo, (JP)--

Signed and Sealed this
Fourteenth Day of June, 2011

David J. Kappos
*Director of the United States Patent and Trademark Office*